(12) United States Patent
Huang

(10) Patent No.: US 6,871,155 B2
(45) Date of Patent: Mar. 22, 2005

(54) SENSING CIRCUIT FOR SINGLE BIT-LINE SEMICONDUCTOR MEMORY DEVICE

(75) Inventor: Shih-Huang Huang, Hsin-Chu (TW)

(73) Assignee: Mediatek Incorporation, Hsin-Chu Hsien (TW)

(*) Notice: Subject to any disclaimer, the term of this patent is extended or adjusted under 35 U.S.C. 154(b) by 57 days.

(21) Appl. No.: 10/604,472

(22) Filed: Jul. 23, 2003

(65) Prior Publication Data
US 2004/0186678 A1 Sep. 23, 2004

(30) Foreign Application Priority Data
Mar. 21, 2003 (TW) .......................................... 92106411 A

(51) Int. Cl.[7] ................................................ G11C 7/00
(52) U.S. Cl. ........................ 702/117; 365/203; 365/207
(58) Field of Search ................................ 702/117, 186; 365/109, 149, 185.2, 185.12, 185.17, 185.18, 185.21, 185.22, 189.1, 189.09, 189, 191, 198, 201, 203, 207, 208, 210, 226, 230.03, 233; 711/5, 169; 714/718, 719, 720, 721, 722, 724, 755

(56) References Cited

U.S. PATENT DOCUMENTS

| | | | | |
|---|---|---|---|---|
| 5,208,773 A | * | 5/1993 | Okitaka et al. | 365/189.04 |
| 5,285,069 A | * | 2/1994 | Kaibara et al. | 257/392 |
| 5,315,555 A | * | 5/1994 | Choi | 365/207 |
| 5,654,926 A | * | 8/1997 | Kanzaki | 365/203 |
| 5,671,174 A | * | 9/1997 | Koike et al. | 365/203 |
| 5,761,109 A | * | 6/1998 | Takashima et al. | 365/63 |
| 5,835,432 A | * | 11/1998 | Nakano | 365/205 |
| 5,870,343 A | * | 2/1999 | Chi et al. | 365/203 |
| 5,894,440 A | * | 4/1999 | Tsukude et al. | 365/190 |
| 6,049,492 A | * | 4/2000 | Vogelsang et al. | 365/196 |
| 2004/0085844 A1 | * | 5/2004 | Arimoto et al. | 365/210 |

* cited by examiner

Primary Examiner—Carol S. W. Tsai
(74) Attorney, Agent, or Firm—Winston Hsu

(57) ABSTRACT

A sensing circuit for sensing logic data is shown. A memory cell is electrically connected to a bit line. The sensing circuit contains a first pre-charging module electrically connected to the bit line for pre-charging the bit line. A selecting module is electrically connected between the bit line and a first data line for transmitting signals and for isolating capacitances. A second pre-charging module is electrically connected to the first data line for pre-charging the first data line. A first voltage keeping module is electrically connected to the first data line for maintaining the signal on the first data line at a high voltage level. An isolating module is electrically connected between the first data line and a second data line for transmitting signals and for isolating capacitances. Finally, a third pre-charging module is electrically connected to the second data line for pre-charging the second data line.

15 Claims, 4 Drawing Sheets

SENSING CIRCUIT FOR SINGLE BIT-LINE SEMICONDUCTOR MEMORY DEVICE

BACKGROUND OF INVENTION

1. Field of the Invention

The invention relates to a sensing circuit, and more particularly, to a sensing circuit for a single bit-line semiconductor memory device.

2. Description of the Prior Art

Memory is one of the key components in electronic equipment on the market. Memory can be divided into two groups by the way the memory stores information: volatile memory and nonvolatile memory. A memory is called a volatile memory because it is the kind of storage device that when the power is cut, digital data stored in the volatile memory will be lost. For example, products such as DRAM or SDRAM belong to the volatile memory group. The advantage of volatile memory is that the access speed is fast, so it is often used as a buffer between a high speed processing unit and other circuits. But the disadvantage of volatile memory is that it cannot keep the data stored in it after the power is cut. On the other hand, nonvolatile memory can keep data stored in it even after the power is cut. However, the disadvantage of nonvolatile memory is that the access speed is slower than volatile memory. Products such as ROM or flash memory belong to the nonvolatile memory group.

The application of volatile memory is very broad, in addition to being used in personal computers as a data storage device, volatile memory is also used for storing digital data in devices such as cell phones, personal digital assistants, and laptop computers.

Generally speaking, a memory installed in an electronic device can perform basic mode operations according to a controlling signal from the electronic device, such as write mode, erase mode and read mode. In write mode, the electronic device writes digital data into specific storage addresses of the memory according the controlling signal; in erase mode the electronic device erases digital data at specific storage addresses of the memory according the controlling signal; in read mode the electronic device reads digital data out from specific storage address of the memory according the controlling signal.

A memory always includes a sensing circuit (or a sensing amplifier) for reading out data at specific storing addresses in the memory according to instruction of controlling signal. The sensing circuit is electrically connected to a memory cell array in the memory used for storing digital data. In the 1998 "Symposium on VLSI Circuits Digest of Technical Papers", page 158 to page 161, a sensing circuit is disclosed. Please refer to FIG. 1, which is a circuit diagram of a single bit-line ROM sensing circuit of the prior art. In FIG. 1, the ROM contains a sensing circuit 10 and a memory cell array 20. Wherein the memory cell array 20 includes a plurality of memory cells 22, the addresses of the memory cells 22 is defined by a plurality of word lines WL1~WLn and a plurality of bit lines BL1~BLn, that is, at the cross point of each word line and each bit line there is a memory cell 22 electrically connected to the word line and the bit line. In FIG. 1, each memory cell 22 is an NMOS transistor, the drain being electrically connected to the bit line, the gate being electrically to the word line, and the source being electrically connected to ground.

Using a bit line BL1 as an example, the bit line BL1 is electrically connected to the sensing circuit 10. The sensing circuit 10 contains a first pre-charging module 12, a selecting module 14, a second pre-charging module 16, and a sensing-locking module 18. The first pre-charging module 12 is electrically connected to the bit line BL1 for pre-charging the bit line BL1. In FIG. 1, the first pre-charging module 12 is an NMOS transistor for pre-charging the bit line BL1 to 0V, the drain being electrically connected to the bit line BL1, the gate being electrically connected to a controlling signal Y1b. The selecting module 14 is electrically connected between the bit line BL1 and a data line DL, for passing the signal on the bit line BL1 to the data line DL according to the controlling signals Y1 and Y1b. In FIG. 1, selecting module 14 is a transmission gate containing an NMOS transistor and a PMOS transistor, and the turn on and turn off of the transmission gate is controlled by the controlling signals Y1 and Y1b. The second pre-charging module 16 is used for pre-charging the data line DL. In FIG. 1, the second pre-charging module 16 is a PMOS transistor, the drain being electrically connected to the data line DL, the gate being electrically connected to a controlling signal PRE, the source being electrically connected to a power supply voltage VDD, for pre-charging the data line DL to VDD. The sensing-locking module 18 is electrically connected to the data line DL and is for sensing the digital signal on the data line DL and locking to the digital signal to generate an output signal on the output signal line OUT.

Please notice that the above description only uses one bit line BL1 as an example, in reality there are more than one bit line being electrically connected to the same data line DL via the selecting module 14, as shown in FIG. 1.

Described next is the job flow of how the ROM in FIG. 1 uses the sensing circuit 10 to read data. When the ROM reads digital data stored in the memory cell array 20, a controlling unit (not shown in FIG. 1) uses the controlling signals to control the first pre-charging module to pre-charge the bit line (such as bit line BL1) corresponding to the address of the desired data to 0V, and then uses the controlling signal Y1 and Y1B to turn on the selecting module 14. A controlling signal PRE is next used to control the second pre-charging module 16 to pre-charge the data line DL and the bit line BL1 to VDD. Finally, the controlling unit inputs a high voltage to the word line (such as word line WL1) corresponding to the address of the desired data such that data stored in the selected memory cell 22 (in this example, the memory cell located at the cross point of bit line BL1 and word line WL1) is output to the output line OUT via the bit line BL1, the data line DL, and the sensing-locking module 18.

However, there is a significant flaw in the sensing circuit 10 shown in FIG. 1. When the memory cell 22 first stores digital value 0, the memory cell 22 is at low threshold voltage state. To read out the "0" stored in the memory cell 22, the selected bit line BL1 and data line DL must be pre-charged to VDD and discharged to 0V via the path to ground of the turn on the memory cell 22, ending the reading process. Because the bit line BL1 is electrically connected to multiple memory cells 22 and the data line DL is electrically connected to multiple selecting modules 14, the bit line BL1 and the data line DL combine with a very large parasitic capacitance because they have a very large layout area. Therefore, during the process of reading the logic value "0", both the second pre-charging module 16 and the selected memory cell 22 must charge (or discharge) the bit line BL1 and the data line DL, which have a very large parasitic capacitance. This causes a direct constraint on the speed of the ROM. Additionally, charging (or discharging) the bit line BL1 and the data line DL with a very large parasitic capacitance consumes a large amount of power.

SUMMARY OF INVENTION

It is therefore a primary objective of the claimed invention to provide a sensing circuit used for a single bit-line semiconductor memory device to solve the above-mentioned problem.

Provided according to the claimed invention is a sensing circuit for sensing the logic data stored in a memory cell. The memory cell is electrically connected to a bit line. The sensing circuit comprises a first pre-charging module electrically connected to the bit line for pre-charging the bit line. A selecting module is electrically connected to the bit line and a first data line for transmitting signals of the bit line to the first data line according to a first controlling signal and isolating the capacitance of the bit line and the first data line. A second pre-charging module is electrically connected to the first data line for pre-charging the first data line. A first voltage keeping module is electrically connected to the first data line for maintaining the signal on the first data line at a high voltage level when a logic value "1" is stored in the memory cell. An isolating module is electrically connected between the first data line and a second data line for transmitting signals of the first data line to the second data line according to a second controlling signal and isolating the capacitance of the first data line and the second data line. Finally a third pre-charging module is electrically connected to the second data line for pre-charging the second data line.

In the claimed invention, the sensing circuit uses a selecting module and an isolating module such that when a logic value "1" is stored in the memory cell, the parasitic capacitance between the bit line and the first data line is separated from the parasitic capacitance between the first data line and the second data line. The voltage keeping module is used for keeping the signal on the data line at a high voltage level so that the parasitic capacitance effect will not be as serious as in the prior art and the time needed to read data will be decreased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
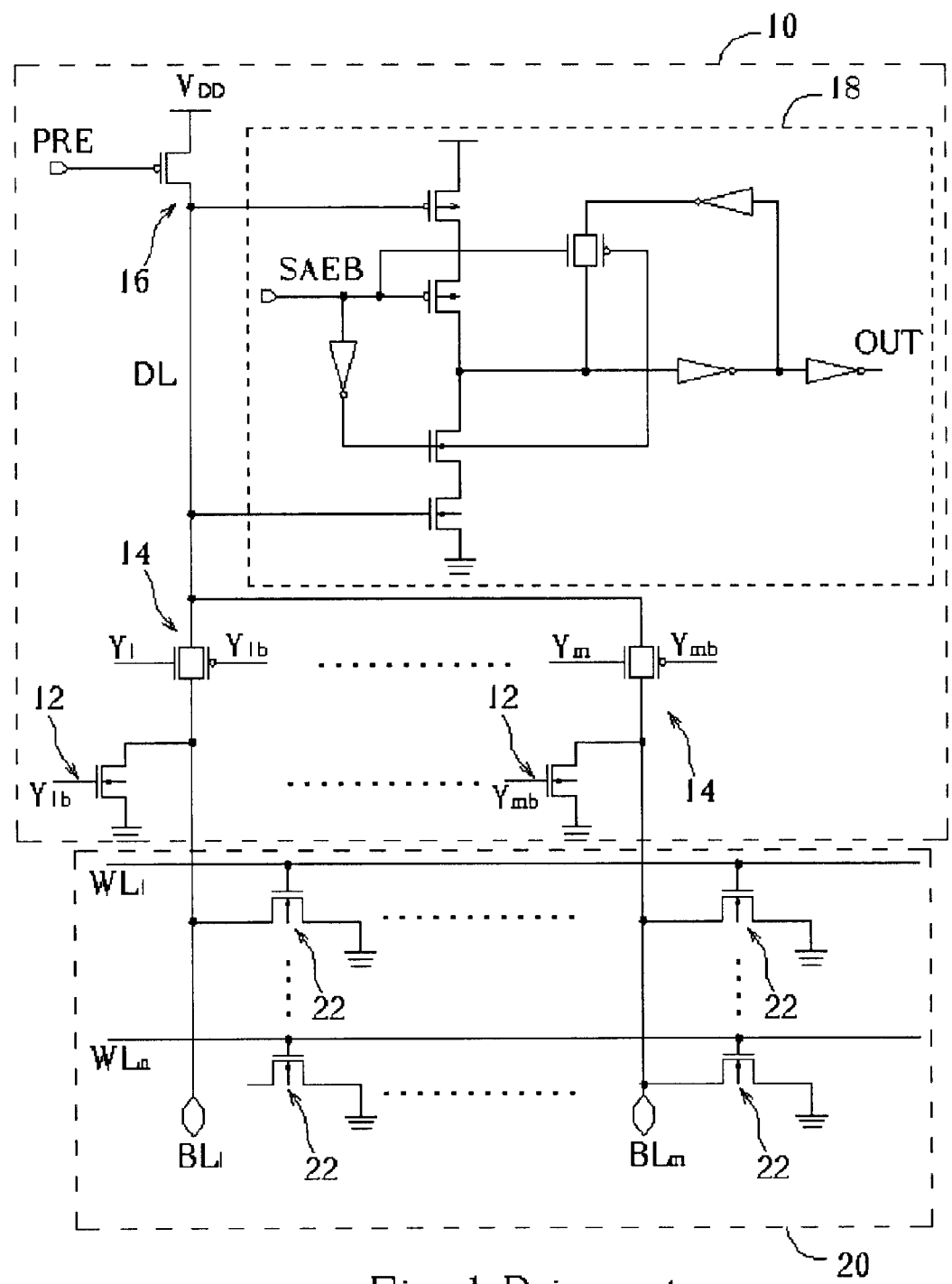
FIG. 1 is a circuit diagram of a single bit-line ROM sensing circuit of the prior art.
Figure 2:
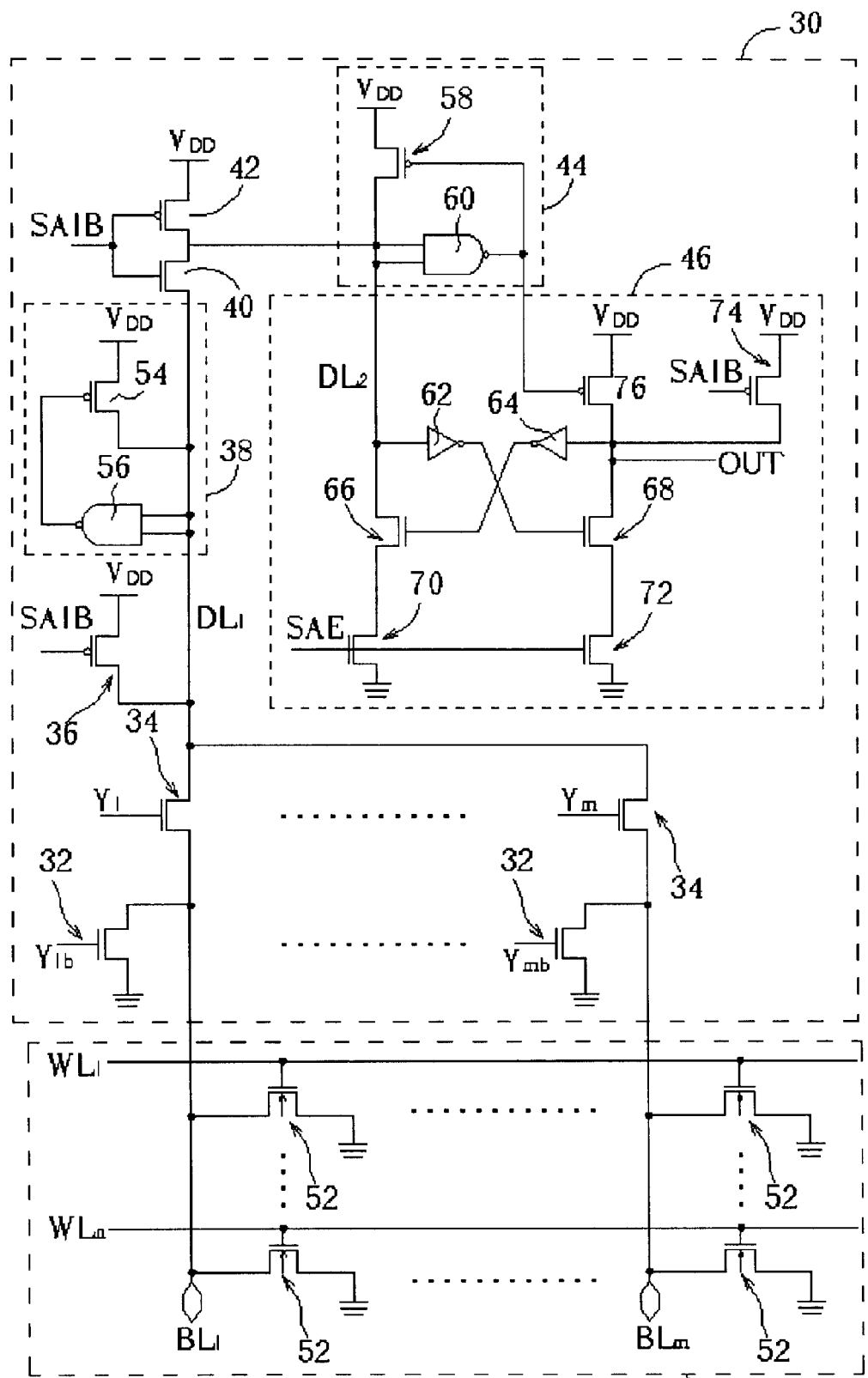
FIG. 2 is a circuit diagram of a sensing circuit for a single bit-line semiconductor device according to the present invention.

Please refer to FIG. 2. FIG. 2 is a circuit diagram of a sensing circuit of single bit-line semiconductor device according to the present invention. In FIG. 2, the semiconductor memory device contains a sensing circuit 30 and a memory cell array 50, wherein the memory cell array 50 in FIG. 2 is the same as the memory cell 20 in FIG. 1. The memory cell array 50 includes a plurality of memory cells 52, the addresses of the memory cells 52 is defined by a plurality of word lines $WL_1 \sim WLn$ and a plurality of bit lines $BL_1 \sim BLm$. There is a memory cell 52 at the cross point of each word line and each bit line being electrically connected to the word line and the bit line. In FIG. 2, a memory cell 52 is an NMOS transistor, the drain being electrically connected to the bit line, the gate being electrically connected to the word line, and the source being electrically connected to ground.

The following description uses a single bit-line (for example the bit line $BL_1$ is used). In FIG. 2, the bit line $BL_1$ is electrically connected to the sensing circuit 30. The sensing circuit 30 contains a first pre-charging module 32 for pre-charging the bit line $BL_1$, being electrically connected to the bit line $BL_1$. A selecting module 34 is electrically connected between the bit line $BL_1$ and a first data line $DL_1$, for passing the signal on the bit line $BL_1$ to the first data line $DL_1$ according to a controlling signal Y1, and isolating the capacitance of the bit line $BL_1$ and the first data line $DL_1$. A second pre-charging module 36 is electrically connected to the first data line $DL_1$ for pre-charging first data line $DL_1$. A first voltage keeping module 38 is electrically connected to the first data line $DL_1$ for keeping the signal on the first data line $DL_1$ at a high voltage level while a logic value "1" is stored in the memory cell 52. An isolating module 40 is electrically connected between the first data line $DL_1$ and a second data line $DL_2$, for passing the signal on the first data line $DL_1$ to the second data line $DL_2$, according to a second controlling signal SAIB, and isolating capacitance of the first data line $DL_1$ and the second data line $DL_2$. A third pre-charging module 42 is electrically connected to the second data line $DL_2$, for pre-charging the second data line $DL_2$.

Please note that, in the above paragraph, a single bit-line $BL_1$ was used as an example. There are actually always a plurality of bit lines being electrically connected to the same first data line $DL_1$ via the selecting modules 34, as shown in FIG. 2.

As the embodiment in FIG. 2 shows, the first pre-charging module 32 is an NMOS transistor, the drain being electrically connected to the bit line $BL_1$, the gate being electrically connected to a signal Y1b, which is the inverse of the first controlling signal Y1, and the source being electrically connected to ground. The first pre-charging module 32 is controlled by the signal Y1b and is turned on to pre-charge the bit line $BL_1$ according to the signal Y1b. The selecting module 34 is an NMOS transistor, the drain being electrically connected to the first data line $DL_1$, the gate being electrically connected to the first controlling signal Y1, and the source being electrically connected to the bit line $BL_1$. The second pre-charging module 36 is a PMOS transistor, the drain being electrically connected to the first data line $DL_1$, the gate being electrically connected to the second controlling signal SAIB, and the source being electrically connected to the power supply voltage $V_{DD}$. The second pre-charging module 36 is turned on according to the second controlling signal SAIB and pre-charges the first data line $DL_1$. The isolating module 40 is an NMOS transistor, the drain being electrically connected to the second data line $DL_2$, the gate being electrically connected to second controlling signal SAIB, and the source being electrically connected to the first data line $DL_1$. The third pre-charging module 42 is a PMOS transistor, the drain being electrically connected to the second data line $DL_2$, the gate being electrically connected to the second controlling signal SAIB, and the source being electrically connected to the power supply voltage $V_{DD}$. The third pre-charging module 42 is turned on by the second controlling signal SAIB and pre-charges the second data line $DL_2$.

As shown in FIG. 2, in this embodiment, the first voltage keeping module 38 includes a PMOS transistor 54, the source being electrically connected to the power supply voltage $V_{DD}$, the drain being electrically connected to the first data line $DL_1$. A NAND logic gate 56 contains two input ends and an output end, the input ends being electrically connected to the first data line $DL_1$, the output end being electrically connected to the gate of the PMOS transistor 54. In such a configuration, when signal on first data line $DL_1$ is a voltage value close to the power supply voltage $V_{DD}$, because the NAND logic gate 56 considers the voltage value as a logic value "1", the output end of the NAND logic gate 56 will be a logic value "0" (that is, 0V), and the PMOS transistor 54 will turn on, causing the power supply voltage $V_{DD}$ to charge the first data line $DL_1$ through the channel of the PMOS transistor 54. The signal on the first data line $DL_1$ approaches $V_{DD}$ and the first voltage keeping module 38 maintains a high voltage level. When the signal on the first data line $DL_1$ is a voltage value close to ground value (0V), the NAND logic gate 56 considers the voltage value as a logic value "0" and the output end of the NAND logic gate 56 outputs a logic value "1" (that is, $V_{DD}$). The PMOS transistor 54 turns off, so the first voltage keeping module 38 has no effect on the first data line $DL_1$.

To increase the reading speed of the sensing circuit 30 of the present invention, the sensing circuit 30 can further contain a second voltage keeping module 44 and a waveform reshaping module 46, as shown in FIG. 2. In FIG. 2, the second voltage keeping module 44 is electrically connected to the second data line $DL_2$ for keeping the signal on the second data line $DL_2$ at a high voltage level while a logic value "1" is stored in the desired memory cell 52. The waveform reshaping module 46 is electrically connected to the second data line $DL_2$, for sensing signal on second data line $DL_2$ and generating an output signal on an output signal line OUT.

As shown in FIG. 2, the second voltage keeping module 44 has the same configuration and the same function as the first voltage keeping module 38. It contains a PMOS transistor 58, the source being electrically connected to the power supply voltage $V_{DD}$ and the drain being electrically connected to the second data line $DL_2$ Also contained is a NAND logic gate 60 containing two input ends and an output end, the two input ends being electrically connected to the second data line $DL_2$ and the output end being electrically connected to the gate of the PMOS transistor 58. Under the same configuration as the first voltage keeping module 44, while signal on the second data line $DL_2$ is a voltage value close to the power supply voltage $V_{DD}$, because the NAND logic gate 60 considers this voltage value as a logic value"1", the output end of the NAND logic gate 60 is a logic value "0" (that is, 0V). The PMOS transistor 58 is turned on, allowing the power supply voltage $V_{DD}$ to charge the second data line $DL_2$ through the channel of the PMOS transistor 58 such that the signal on the second data line $DL_2$ will be close to $V_{DD}$ and maintained at high voltage level. While the signal on the second data line $DL_2$ has a voltage value close to ground value (0V), because the NAND logic gate 60 considers this voltage value as a logic value"0", the output end of the NAND logic gate 60 outputs a logic value "1" (that is, $V_{DD}$). The PMOS transistor 58 is turned off and the second voltage keeping module 44 has no effect on the second data line $DL_2$.

As shown in the embodiment in FIG. 2, the waveform reshaping module 46 contains a first inverter 62, which has an input end and an output end. The input end of first inverter 62 is electrically connected to the second data line $DL_2$. A second inverter 64 has an input end and an output end and the input end of the second inverter 64 is electrically connected to the output signal line OUT. A first NMOS transistor 66 has its drain electrically connected to the second data line $DL_2$ and its gate electrically connected to the output end of the second inverter 64. Additionally a second NMOS transistor 68 has its drain electrically connected to the output signal line OUT and its gate electrically connected to the output end of the first inverter 62. While the waveform reshaping module 46 depicted above is enabled, it will sense the signal on the second data line $DL_2$, and through the configuration of the waveform reshaping module 46 combined with two inverters 62,64 and two NMOS transistors 66,68, it will generate an output signal of the digital data stored in the desired memory cell 52 on the output signal line OUT.

Please note that the waveform reshaping module 46 can further contain a third NMOS transistor 70, the drain being electrically connected to the source of the first NMOS transistor 66, the gate being electrically connected to a third controlling signal SAE, and the source being electrically connected to ground. A fourth NMOS transistor 72 has its drain electrically connected to the source of the second NMOS transistor 68, its gate electrically connected to the third controlling signal SAE, and its source electrically connected to ground. The effect of the third NMOS transistor 70 and the fourth NMOS transistor 72 is to turn on or turn off the channel according to the third controlling signal SAE and to enable or disable the waveform reshaping module 46. In other words, the third and the fourth NMOS transistors 70,72 are used to control the waveform reshaping module 46. The waveform reshaping module 46 can further contain a fourth pre-charging module 74, being electrically connected to the output signal line OUT for pre-charging the output signal line OUT. In this embodiment, the fourth pre-charging module 74 is a PMOS transistor, the drain being electrically connected to the output signal line OUT, the gate being electrically connected to the second controlling signal SAIB, and the source being electrically connected to the power supply voltage $V_{DD}$. Fourth pre-charging module 74 will be turn on according to the second controlling signal SAIB so as to pre-charge the output signal line OUT.

Finally, as shown in FIG. 2, the waveform reshaping module 46 further contains a PMOS transistor 76, the drain being electrically connected to the output signal line OUT, the gate being electrically connected to the output end of the NAND logic gate 60 of the second voltage keeping module 44, and the source being electrically connected to the power supply voltage $V_{DD}$. In this configuration, while the signal on the second data line $DL_2$ is a voltage value close to the power supply voltage $V_{DD}$, because the NAND logic gate 60 considers this voltage value as a logic value "1", the output end of the NAND logic gate 60 outputs a logic value "0" (that is, 0V). The PMOS transistor 76 turns on allowing power supply voltage $V_{DD}$ to charge the output signal line OUT through the channel of the PMOS transistor 76 such that the signal on the output signal line OUT will be close to $V_{DD}$ and maintain at a high voltage level. While the signal on the second data line $DL_2$ is a voltage value close to ground value (0V), because the NAND logic gate 60 considers this voltage value as a logic value "0", the output end of the NAND logic gate 60 will output a logic value "1" (that is, $V_{DD}$ ). The PMOS transistor 76 turns off so that the second voltage keeping module 44 has no effect on the output signal line OUT.

Figure 3:
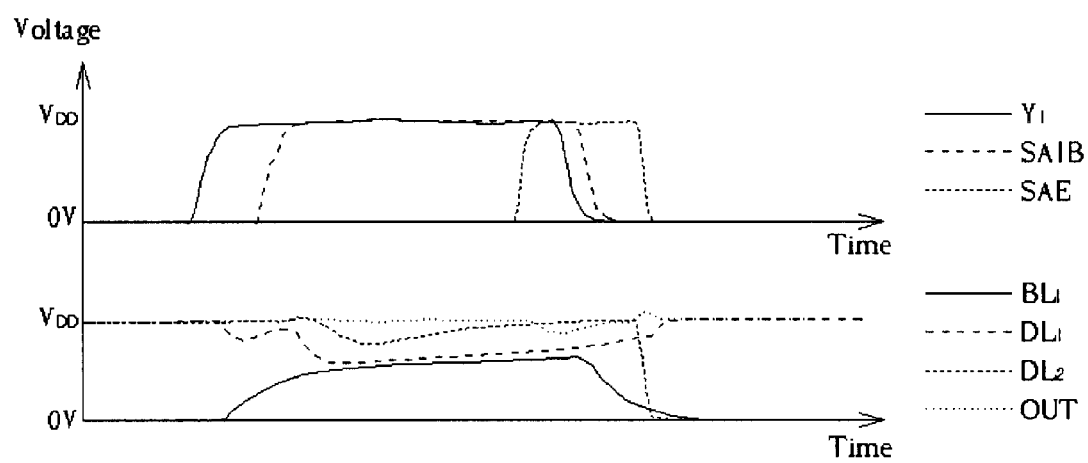
FIG. 3 is a time chart for when the sensing circuit in FIG. 2 reads a logic value "1".
Figure 4:
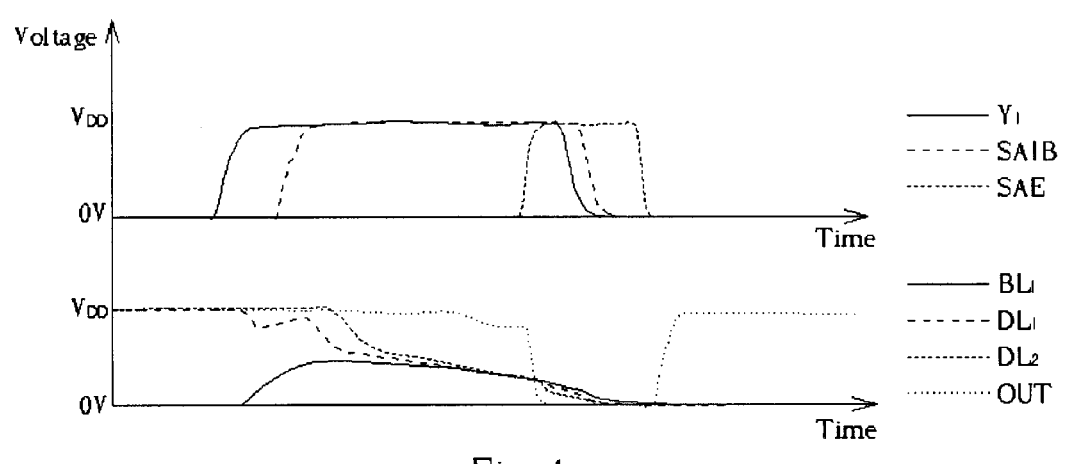
FIG. 4 is a time chart for when the sensing circuit in FIG. 2 reads a logic value "0".

Please refer to FIG. 2, FIG. 3 and FIG. 4. The operating principle of the sensing circuit 30 of the present invention is as follows. FIG. 3 shows a time chart of each controlling signal and the signal on each line in FIG. 2 while sensing circuit 30 is reading a digital data "1" from one memory cell 52 of the memory cell array 50 (such as the memory cell 52 at the cross point of the word line $WL_1$ and the bit line $BL_1$). FIG. 4 shows a time chart of each controlling signal and the signal on each line in FIG. 2 while the sensing circuit 30 is reading a digital data "0" from one memory cell 52 of the memory cell array 50 (such as the memory cell 52 at the cross point of the word line $WL_1$ and the bit line $BL_1$). In FIG. 3 and FIG. 4, the first controlling signal Y1, the second controlling signal SAIB, the third controlling signal SAE, the signal on bit line $BL_1$, the signal on the first data line $DL_1$, the signal on the second data line $DL_2$, and the signal on the output signal line OUT are shown.

Please notice that, for convenience, in FIG. 3 and FIG. 4 the three active controlling signals Y1, SAIB, SAE are drawn on one time axis and the passive signals $BL_1$, $DL_1$, $DL_2$, and OUT are drawn on another time axis. In this example, the signal Y1$b$ is the inverse of the first controlling signal Y1, so as it is complementary to the first controlling signal Y1, it is not necessary to be included it in FIG. 3 and FIG. 4. Additionally, the signal on the word line $WL_1$ is synchronous to the first controlling signal Y1 and is also not necessary to be included in FIG. 3 and FIG. 4.

Please refer to FIG. 3 for the following description of the operating principle of the sensing circuit 30 while reading a digital data "1" in the memory cell 52 of the memory cell array 50. At this time, the memory cell 52 is at a high threshold voltage. Before the reading process begins, the first controlling signal Y1 is at a logic value "0" (that is 0V), the inverse signal Y1$b$ is at a logic value "1" (that is $V_{DD}$), the second controlling signal SAIB is at a logic value "0", the third controlling signal SAE is at a logic value "0", and the signal on the word line$WL_1$ is synchronous to the first controlling signal so is also at logic value "0". Under these circumstances, the selecting module 34 and the isolating module 40 are turned off, and the first, second, third, and fourth pre-charging modules 32, 36, 42, 74 are turned on to pre-charge the bit line $BL_1$ to 0V. The first data line $DL_1$, the second data line $DL_2$, and the output signal line OUT are all pre-charged to $V_{DD}$.

When the reading process starts, the first controlling signal Y1 and the word line $WL_1$ are changed to a logic value "1", so the first pre-charging module 32 is turned off while the selecting module 34 is turned on. However, because the memory cell 52 is at high threshold voltage, it remains at a turned off state. The signal on bit line $BL_1$ elevates, but because of the selecting module 34, the signal on bit line $BL_1$ can at most reach $V_{DD}$-$_{TH}$ (that is the threshold voltage of the selecting module 34).

The second controlling signal SAIB then changes to a logic value "1" so the second, third, and fourth pre-charging modules 36, 42, 74 are all turned off and the isolating module 40 is turned on. At this time, the signal on the first data line $DL_1$ and the second data line $DL_2$ is smaller than but close to $V_{DD}$ so the first and second voltage keeping modules 38,44 start to elevate the signal on the first data line $DL_1$ and the second data line DL2 toward $V_{DD}$. In the mean time, the selecting module 34 and the isolating module 40 are both at saturation state and the current flowing through them is very small so the selecting module 34 and the isolating module 40 produce a large resistance. The capacitance between bit line $BL_1$ and the first data line $DL_1$ is isolated from the capacitance between the first data line $DL_1$ and the second data line $DL_2$. Under such circumstances, the huge parasitic capacitance on the bit line $BL_1$ does not easily share the electrical charge with the first data line $DL_1$ and the first and second voltage keeping modules 38,44 are more effective. Similarly, the second voltage keeping module 44 keeps the signal on the output signal line OUT at $V_{DD}$ through the PMOS transistor 76.

Finally, when the signal on the second data line $DL_2$ reaches a proper value, the third controlling signal is changed to a logic value "1" and the waveform reshaping module 46 starts operating because of the turn on of the third and fourth NMOS transistors. Through the effect of circuit configuration constructed by the inverters 62, 64 and the NMOS transistors 66, 68, the signal on the second data line $DL_2$ and the output signal line OUT is fastened to $V_{DD}$. A logic value "1" is read out from the output signal line OUT and the data reading process is finished. When the data reading process is finished, the first controlling signal Y1, the second controlling signal SAIB, and the third controlling signal SAE are changed back to logic value "0" in sequence for the next data reading process.

Please refer to FIG. 4 for an introduction to the operation principle of the sensing circuit 30 while reading a digital data "0" stored in the memory cell 52 of the memory cell array 50. At this time, the memory cell 52 is at a low threshold voltage state. Before the reading process, the first controlling signal Y1 is at logic value "0" (so its inverted signal Y1$b$ is a logic value "1"), the second controlling signal SAIB is at a logic value "0", the third controlling signal SAE is at a logic value "0", and the signal on word line $WL_1$ is synchronous with the first controlling signal so it is at a logic value"0". Under such circumstances, the selecting module 34 and the isolating module 40 are turned off, while the first, second, third and fourth pre-charging modules 32, 36, 42, 74 are turned on, pre-charging the bit line $BL_1$ to 0V and pre-charging the first data line $DL_1$, the second data line $DL_2$, and the output signal line OUT to $V_{DD}$.

After the reading process is started, the first controlling signal Y1 and the word line WL1 are simultaneously changed to a logic value "1" and the first pre-charging module 32 is turned off while the selecting module 34 is turned on. Because memory cell 52 is at a low threshold voltage state, it is turned on to discharge the bit line $BL_1$. The channel signal on the bit line $BL_1$ will elevate but because of the effect of the selecting module 34, the signal on the bit line $BL_1$ can at most reach $V_{DD}$-$V_{TH}$ (that is, the threshold voltage of the selecting module 34).

Next, the second controlling signal SAIB is changed to a logic value "1", the second, third, and fourth pre-charging modules 36, 42, 74 are turned off, while the isolating module 40 is turned on. Because the signal on the first data line $DL_1$ and the second data line $DL_2$ is smaller than $V_{DD}$ and closer to 0V, the first and the second voltage keeping modules 38, 44 have no effect. The signal on the first data line $DL_1$ and the second data line $DL_2$ start sharing the electrical charge with the huge parasitic capacitance on the bit line $BL_1$ and become synchronous with the signal on the bit line $BL_1$. They are discharged by the already turned on memory cell 52 and decline toward 0V.

Finally, after the signal on the second data line $DL_2$ reaches a proper value, the third controlling signal changes to a logic value "1" and the waveform reshaping module 46 start operating because the turn on of the third and fourth NMOS transistors 66,68. Through the effect of circuit configuration of the inverters 62, 64 and the NMOS transistors 66, 68, the signal on second data line $DL_2$ and the output signal line OUT stabilizes to 0V very quickly so a logic value "0" is read out from the output signal line OUT and the data reading process is finished. After the reading process finishes, the first controlling signal Y1, the second controlling signal SAIB and the third controlling signal SAE change back to a logic value "0" in sequence for the next reading process.

In contrast to the prior art, the present invention sensing circuit uses a selecting module and an isolating module to isolate capacitance between a bit line and a first data line and capacitance between the first data line and a second data line while reading logic data "1". At least one voltage keeping module is used to maintain the signal on the data line at a high voltage level. The present invention sensing circuit uses a huge parasitic capacitance on the bit line to synchronize the signal on the first data line and the second data line with the signal on the bit line while reading a logic data "0". A waveform reshaping module is then used to speed up the data sensing so the sensing circuit of the present invention has a faster speed than the prior art while reading data.

Those skilled in the art will readily observe that numerous modifications and alternations of the device may be made while retaining the teaching of the invention. Accordingly, the above disclosure should be construed as limited only by the metes and bonds of the appended claims.

What is claimed is:

1. A sensing circuit for sensing the logic data stored in a memory cell, the memory cell being electrically connected to a bit line, the sensing circuit comprising:
   a first pre-charging module, electrically connected to the bit line, for pre-charging the bit line;
   a selecting module, electrically connected to the bit line and a first data line, for transmitting signals of the bit line to the first data line according to a first controlling signal and isolating the capacitance of the bit line and the first data line;
   a second pre-charging module, electrically connected to the first data line, for pre-charging the first data line;
   a first voltage keeping module, electrically connected to the first data line, for maintaining the signal on the first data line at a high voltage level when a logic value "1" is stored in the memory cell;
   an isolating module, electrically connected between the first data line and a second data line, for transmitting signals from the first data line to the second data line according to a second controlling signal and isolating the capacitance of the first data line and the second data line; and
   a third pre-charging module, electrically connected to the second data line, for pre-charging the second data line.

2. The sensing circuit of claim 1 wherein the first voltage keeping module comprises:
   a PMOS transistor, the source being electrically connected to a power supply voltage, the drain being electrically connected to the first data line; and
   a NAND logic gate, comprising two input ends and one output end, the two input ends being electrically connected to the first data line, the output end being electrically connected to the gate of the PMOS transistor.

3. The sensing circuit of claim 1 further comprising a second voltage keeping module, electrically connected to the second data line, for maintaining the signal on the second data line at a high voltage level when a logic value "1" is stored in the memory cell.

4. The sensing circuit of claim 3 wherein the second voltage keeping module comprises:
   a PMOS transistor, the source being electrically connected to a power supply voltage, the drain being electrically connected to the second data line; and
   a NAND logic gate, comprising two input ends and one output end, the two input ends being electrically connected to the second data line, the output end being electrically connected to the gate of the PMOS transistor.

5. The sensing circuit of claim 4 further comprising a waveform reshaping module, electrically connected to the second data line, for sensing the signals of the second data line in order to generate an output signal on an output signal line.

6. The sensing circuit of claim 5 wherein the waveform reshaping module comprises:
   a first inverter, comprising an input end and an output end, the input end being electrically connected to the second data line;
   a second inverter, comprising an input end and an output end, the input end being electrically connected to the output signal line;
   a first NMOS transistor, the drain being electrically connected to the second data line, the gate being electrically connected to the output end of the second inverter; and
   a second NMOS transistor, the drain being electrically connected to the output signal line, the gate being electrically connected to the output end of the first inverter.

7. The sensing circuit of claim 6 wherein the waveform reshaping module further comprises:
   a third NMOS transistor, the drain being electrically connected to the source of the first NMOS transistor, the gate being electrically connected to a third controlling signal, the source being electrically connected to ground; and
   a fourth NMOS transistor, the drain being electrically connected to the source of the second NMOS transistor, the gate being electrically connected to the third controlling signal, the source being electrically connected to ground.

8. The sensing circuit of claim 5 wherein the waveform reshaping module further comprises a fourth pre-charging module, electrically connected to the output signal line, for pre-charging the output signal line.

9. The sensing circuit of claim 8 wherein the fourth pre-charging module is a PMOS transistor, the drain being electrically connected to the output signal line, the gate being electrically connected to the second controlling signal, and the source being electrically connected to the power supply voltage.

10. The sensing circuit of claim 5 wherein the waveform reshaping module further comprises a PMOS transistor, the drain being electrically connected to the output signal line, the gate being electrically connected to the output end of the NAND logic gate of the second voltage keeping module, the source being electrically connected to the power supply voltage.

11. The sensing circuit of claim 1 wherein the first pre-charging module is a NMOS transistor, the drain being electrically connected to the bit line, the gate being electrically connected to the inverted signal of the first controlling signal, the source being electrically connected to ground.

12. The sensing circuit of claim 1 wherein the selecting module is a NMOS transistor, the drain being electrically connected to the first data line, the gate being electrically connected to the first controlling signal, the source being electrically connected to the bit line.

13. The sensing circuit of claim 1 wherein the second pre-charging module is a PMOS transistor, the drain being electrically connected to the first data line, the gate being electrically connected to the second controlling signal, the source being electrically connected to a power supply voltage.

14. The sensing circuit of claim 1 wherein the isolating module is a NMOS transistor, the drain being electrically connected to the second data line, the gate being electrically connected to the second controlling signal, the source being electrically connected to the first data line.

15. The sensing circuit of claim 1 wherein the third pre-charging module is a PMOS transistor, the drain being electrically connected to the second data line, the gate being electrically connected to the second controlling signal, the source being electrically connected to a power supply voltage.

* * * * *